US007510303B2

(12) United States Patent
Jonsson et al.

(10) Patent No.: US 7,510,303 B2
(45) Date of Patent: Mar. 31, 2009

(54) LED ILLUMINATED LAMP WITH THERMOELECTRIC HEAT MANAGEMENT

(75) Inventors: Thorgeir Jonsson, Reykjavik (IS); Gudlaugur Kristinn Ottarsson, Reykjavik (IS); Sturla Jonsson, Reykjavik (IS); David Allen Hubbell, Saranac Lake, NY (US)

(73) Assignee: Dialight Corporation, South Farmingdale, NJ (US)

( * ) Notice: Subject to any disclaimer, the term of this patent is extended or adjusted under 35 U.S.C. 154(b) by 127 days.

(21) Appl. No.: 10/532,730

(22) PCT Filed: Oct. 28, 2003

(86) PCT No.: PCT/IS03/00032

§ 371 (c)(1),
(2), (4) Date: Feb. 21, 2006

(87) PCT Pub. No.: WO2004/038290

PCT Pub. Date: May 6, 2004

(65) Prior Publication Data

US 2006/0198149 A1 Sep. 7, 2006

(30) Foreign Application Priority Data

Oct. 28, 2002 (IS) .......................................... 6598

(51) Int. Cl.
*F21V 29/00* (2006.01)
(52) U.S. Cl. ...................... 362/294; 362/373
(58) Field of Classification Search ................ 362/294, 362/373, 234–235, 96
See application file for complete search history.

(56) References Cited

U.S. PATENT DOCUMENTS

| 6,252,154 | B1 * | 6/2001 | Kamada et al. | 136/201 |
| 6,832,849 | B2 * | 12/2004 | Yoneda et al. | 362/551 |
| 6,902,291 | B2 * | 6/2005 | Rizkin et al. | 362/153.1 |
| 6,964,501 | B2 * | 11/2005 | Ryan | 362/294 |
| 2002/0070360 | A1 * | 6/2002 | Machi | 250/504 R |
| 2004/0120156 | A1 | 6/2004 | Ryan | |

FOREIGN PATENT DOCUMENTS

EP 1 067 332 A2 1/2001
WO WO 00/37314 6/2000

OTHER PUBLICATIONS

International Search Report.

* cited by examiner

*Primary Examiner*—Ali Alavi
(74) *Attorney, Agent, or Firm*—Harness, Dickey & Pierce, P.L.C.

(57) ABSTRACT

The present invention relates to Light Emitting Diode (LED) based lamps utilising thermoelectric modules improving the efficiency of the lamps. The present invention provides in a first aspect a light illuminating device that comprises at least one light emitting diode (LED), at least one thermoelectric module (TEM) having a first surface which is thermally connected to the LED, a heat sink thermally connected to a second surface of the at least one TEM, a thermally insulating cover creating a chamber substantially insulating the LED from ambient air. The LED may be of any conventional type, the invention however is particularly useful for devices using hi-flux LEDs, including traffic lights, illuminated roadway and/or emergency signs, airport runway lights and such.

23 Claims, 3 Drawing Sheets

LED ILLUMINATED LAMP WITH THERMOELECTRIC HEAT MANAGEMENT

FIELD OF INVENTION

The present invention relates to LED-based lamps utilising thermoelectric modules Improving the efficiency of the lamps.

BACKGROUND OF THE INVENTION

Practical design and application of Light Emitting Diodes (LED) type devices for use in Area Lighting and like schemes are limited by thermal energy-management issues. LED device manufacturers have generally been aiming at developing LED devices that provide greater light output without significant increase in size of the device. This accentuates the problem of heat management; the energy efficiency of LEDs is relatively low, such that only a portion of the consumed energy is converted to light, while the bulk of the energy is converted into heat. Therefore, by by producing more light intensive LEDs more thermal energy is produced in the same unit volume of the device.

It is known that LEDs exhibit negative temperature coefficient aspects, i.e. at fixed power input, as the device's operating heat rises, the device's light output decreases. The relationship between LED decrease in light output due to increased operation temperature can be expressed approximately as a negative linear relationship between the percentage light output and degree C. increase in temperature. That is, as the LED device's operating temperature increases one ° C. it can by approximated that the device will lose about one percent of its light output.

Attempts have been made in the prior art to solve the negative temperature coefficient issues. As an example, in LED highway traffic signal devices housings with ventilation configurations, both of passive (convection-type) and active (fan-driven-type) have been provided to prevent the LED-s from overheating. Present art LED traffic signal devices also address the inherent negative temperature coefficient nature via the electrical power supply. These approaches either increase power to the device to compensate for light output loss or address the form of the provided electrical power such as sine vs. square wave in an attempt to moderate the production of by-product heat, i.e. waste heat.

There is a long-felt need for LED devices of long service life and high electric power-to-light efficiency.

Solid state thermoelectric modules (TEM) also referred to as thermoelectric coolers (TEC) or heat pumps have been used in various applications since the introduction of semiconductor thermocouple materials. Such devices convert electrical energy into a temperature gradient, known as the "Peltier" effect or convert thermal energy from a temperature gradient into electrical energy. By applying a current through a TEM a temperature gradient is created and heat is transferred from one side, the "cold" side of the TEM to the other side, the "hot" side.

TEMs have been considered unsuitable in the art for cooling LED lighting devices as they have been ruled out for insufficient efficiency; that is, if configured and operated with conventional settings the energy cost of operating a TEM for cooling an LED device is more than the energy gained in operating the LED at a reduced temperature.

SUMMARY OF INVENTION

The present inventors have now found that TEMs can surprisingly be used to cool and enhance the light output of LED lighting fixtures and particularly to maintain optimal light output from LED lighting fixtures.

The inventors have analyzed the behaviour of conventional Hi-flux LEDs and such as used in traffic signals and area lighting devices and TEMs and developed mathematical models for that are used to optimize the performance of the TEM-cooled LED devices of the present invention.

Thermal Properties of High Flux LEDs

As seen in FIG. 2, the light emission from conventional Hi-flux 1 W LEDs as a function of temperature can be approximated as exponential functions By measuring the light output of two LEDs, amber and red, empirical functions were derived defining the temperature-dependent behavior of the diodes. The functions define relative output ($\eta$) normalized around 25° C. and will be valid for temperatures from about −20° C. up to about 110° C. The functions for the amber diode ($\eta_A$) and red diode ($\eta_R$) are shown as Equation Ia and Ib respectively.

$$\eta_A(T) = \quad\quad\quad\quad\quad\quad\quad\quad\quad\quad\quad\quad\quad\quad\text{Eq. Ia \& Ib}$$

$$e^{\left(\frac{25.6-T}{61.6°C.}\right)} \cdot \eta_A(25.6° \text{ C.}) \quad \eta_R(T) = e^{\left(\frac{24.6-T}{95.4°C.}\right)} \cdot \eta_R(24.6° \text{ C.})$$

A LED reference temperature can be defined as "$T_0$=298.75K" for amber, but "$T_0$=297.75K" for red. Also, a LED characteristic temperature ($T_L$) for a specific LED can be defined and is "$T_L$=61.6K" for amber, but "$T_L$=94.5K" for a red LED.

A low temperature operation of the LED is beneficial due to reduced waste heat generation. It is, however, not possible to "save energy" by cooling, in fact the "saved" energy is converted to light. Thus, by cooling the LED, less energy (e.g., fewer diodes) can be used to produce the same amount of light.

COP or the coefficient of performance is the amount of heat carried around in a system, divided by the work in doing so. When cooling a LED with a thermoelectric cooler (TEC), the heat pumped will be $P_{LED}(1-\eta_{LED})$ and the work by the TEC in doing so will be $P_{TEC}$.

$$COP(T) = \frac{P_{LED}}{P_{TEC}} \cdot \left(1 - \eta_0 \cdot e^{\left(\frac{T_0-T}{T_L}\right)}\right) \quad\quad \text{Eq. II}$$

Here "$\eta_0 = P_{PHO}/P_{LED\ when\ T\ equals}$" is the LED photon efficiency. A more efficient LED will generate lesser heat and therefore can use a cooling system with a lower COP.

The total power consumed by the LED and TEC system ($P_{SYS}$) will now be:

$$P_{SYS} = P_{LED} + P_{TEC} = P_{LED} \cdot \left(1 + \frac{1 - \eta_0 \cdot e^{\left(\frac{T_0-T}{T_L}\right)}}{COP}\right) \quad \text{Eq. III}$$

The total system power ($P_{SYS}$) converges to the LED power ($P_{LED}$) as the COP of the cooling system approaches infinity.

The Luminal or Photonic power radiated by the LED ($P_{PHO}$) can be related to the total system power. This can be expressed as:

$$P_{PHO} = P_{SYS} \cdot \left( \frac{\eta_0}{\left(1 + \frac{1}{COP}\right) \cdot e^{\left(\frac{T-T_0}{T_L}\right)} - \frac{\eta_0}{COP}} \right) \quad \text{Eq. IV}$$

To realize a certain performance, let $\eta_{SYS} = P_{PHO}/P_{SYS}$ signify the total lamp efficiency with cooling system. Then we can calculate the COP necessary to obtain the desired performance:

$$COP = \frac{(1 - \eta_{LED})}{\left(\frac{\eta_{LED}}{\eta_{SYS}} - 1\right)} \quad \text{Eq. V}$$

As an example if the LED efficiency is 20% and the total efficiency a cooled LED device (lamp efficiency) is acceptable as 15%, a COP=2.4 is needed. Further, if a LAMP efficiency of 18% is required, a COP=7.2 is needed, which is a rather large value, but if LAMP efficiency is acceptable as 10% we can operate the cooling system at COP=0.8 which is a rather modest value.

In the following $T_W$ represents the un-cooled LED temperature and $T_C$ represent the cooled LED temperature with $T_W > T_C$. To benefit from cooling, the following inequality must be fulfilled:

$$\frac{P_{LED}}{P_{SYS}} < \frac{e^{\left(\frac{T_W - T_0}{T_L}\right)}}{\left(1 + \frac{1}{COP}\right) \cdot e^{\left(\frac{T_C - T_0}{T_L}\right)} - \frac{\eta_0}{COP}} \quad \text{Eq. VI}$$

The inequality in Eq. VI can be solved for the COP as a function of the two temperatures $T_W$ and $T_C$, and the single power quota $\eta_{SYS}$:

$$COP > \frac{P_{LED} \cdot \left(1 - \eta_0 \cdot e^{\left(\frac{T_0 - T_C}{T_L}\right)}\right)}{P_{SYS} \cdot e^{\left(\frac{T_W - T_C}{T_L}\right)} - P_{LED}} = \frac{\eta_{SYS}\left(1 - \eta_0 \cdot e^{\left(\frac{T_0 - T_C}{T_L}\right)}\right)}{e^{\left(\frac{T_W - T_C}{T_L}\right)} - \eta_{SYS}} \quad \text{Eq. VII}$$

High COP Operation of Industry Standard Thermoelectric Coolers

The thermoelectric material properties and geometry and electric current, can be represented by two temperatures, "$T_i = Ri/\alpha$" signifying the normalized current driven through the module, and "$T_G = KR/\alpha^2$" signifying the quality of the thermoelectric material. Here $\alpha$ represent the so-called Seebeck Coefficient, measured in Volts/Kelvin, K represents the integrated thermal conductance of the TEM, measured in Watts/Kelvin, and (i) represent the electric current driven through the TEM, measured in Amperes, and (R) represent the DC resistance, measured in Ohms. The Cooling Power of the TEM is expressed as:

$$\dot{Q}_C = \frac{K}{T_G} \cdot \left(T_i \cdot T_C - T_G \cdot \Delta T - \frac{1}{2} \cdot T_i^2\right) \quad \text{Eq. VIII}$$

Here $T_H$ represent the hot side temperature and $T_C$ represent the cold side temperature with $T_H > T_C$, and $\Delta T = T_H - T_C$. The rate of work done in driving the current through the module is expressed as:

$$\dot{W} = \frac{K}{T_G} \cdot (T_i + \Delta T) \cdot T_i \quad \text{Eq. IX}$$

The rate of heat rejected out of the hot side of the thermoelectric module is calculated as:

$$\dot{Q}_H = \frac{K}{T_G} \cdot \left(T_i \cdot T_H - T_G \cdot \Delta T + \frac{1}{2} \cdot T_i^2\right) \quad \text{Eq. X}$$

The so-called "coefficient of performance", COP, is defined as the cooling power divided by the rate of work done by the thermoelectric power supply:

$$COP = \frac{\dot{Q}_C}{\dot{W}} = \frac{T_C \cdot T_i - T_G \cdot \Delta T - \frac{1}{2} \cdot T_i^2}{(\Delta T + T_i) \cdot T_i} \quad \text{Eq. XI}$$

The electric current that maximizes the COP can be obtained analytically from equation XI by differentiation and equating the result to zero:

$$i_{COPMAX} = \frac{K \cdot \Delta T}{\alpha \cdot \overline{T}} \cdot \left(1 + \sqrt{1 + \frac{\overline{T}}{T_G}}\right) \quad \text{Eq. XII}$$

$\overline{T}$(bar) is the average temperature equal to $(T_H + T_C)/2$, usually in the center of the thermoelectric material along the thermal gradient.

Heat Sink Parameters for a LED-TEC System

The heat sink requirements can be assessed by sufficient accuracy with a single physical heat transfer coefficient (h) measured in [W/m²K] and its effective area (A) measured in [m²]. To balance the heat sink operating in an ambient temperature of ($T_{amb}$) with the hot side of the TEC at temperature ($T_H$), we have:

$$Q_H = A \cdot h \cdot (T_H - T_{amb}) = \frac{K}{T_G} \cdot \left(T_i \cdot T_H - T_G \cdot \Delta T + \frac{1}{2} \cdot T_i^2\right) \quad \text{Eq. XIII}$$

By defining a characteristic area for the TEC-heat sink combination as "$A_0 = K/h$" measured in [m²], we can simply write:

$$\frac{T_G \cdot T_C - (T_G - T_i) \cdot T_H + \frac{1}{2} \cdot T_i^2}{T_G \cdot (T_H - T_{amb})} = \frac{A}{A_0} \quad \text{Eq. XIV}$$

Now it is possible to eliminate the hot side temperature ($T_H$) to reduce the degrees of freedome for the LED-TEC design:

$$T_H = \frac{A_0 \cdot T_G \cdot T_C + A \cdot T_G \cdot T_{amb} + \frac{1}{2} \cdot A_0 T_i^2}{A_0 \cdot T_G + A \cdot T_G - A_0 \cdot T_i} \qquad \text{Eq. XV}$$

To take an example, for the specified TEC with "K=0.6 W/K", and using the empirical value "h=14 W/m²K", the characteristic area for such a system is "$A_0$=K/h=400 cm²" and corresponds to 20 cm by 20 cm flat surface.

Nonlinear Equations of the Combined LED-TEC-HEAT-SINK System:

Equation V and Equation XI both express the COP for the LED and TEC respectively. When made equal they give nonlinear and transcendental equations in the temperature and efficiency variables of the system.

$$\left(T_i \cdot T_H - T_G \cdot \Delta T + \frac{1}{2} \cdot T_i^2\right) \cdot \eta_S \cdot \exp\left(\frac{T_C - T_0}{T_L}\right) = \qquad \text{Eq. XVI}$$
$$\left(T_i \cdot T_C - T_G \cdot \Delta T - \frac{1}{2} \cdot T_i^2\right) \cdot \exp\left(\frac{T_W - T_0}{T_L}\right) +$$
$$T_i \cdot (T_i + \Delta T) \cdot \eta_0 \cdot \eta_S$$

It should be noted that the analysis can be simplified by only looking at the LED which is being cooled without the constraint relating to the non-cooled diode and setting $T_W$, to equal $T_0$, then the exponential on the right hand side of the equation would cancel out. This would simplify the subsequent analysis as well.

By introducing the shorthand notation "$\beta_C = \exp((T_C - T_0)/T_L)$" and "$\beta_W = \exp((T_W - T_0)/T_L)$", Equation XVI can be rewritten as a second order algebraic equation in the variable ($T_i$). This will give the TEC parameters to satisfy a certain design goal for a specific LED.

$$\frac{1}{2} \cdot T_i^2 + \frac{(T_H \cdot \eta_S \cdot \beta_C + T_C \cdot \beta_W - \Delta T \cdot \eta_0 \cdot \eta_S)}{(\eta_S \cdot \beta_C + \beta_W - 2 \cdot \eta_0 \cdot \eta_S)} \cdot T_i - \qquad \text{Eq. XVII}$$
$$\frac{T_G \cdot \Delta T \cdot (\eta_S \cdot \beta_C - \beta_W)}{(\eta_S \cdot \beta_C + \beta_W - 2 \cdot \eta_0 \cdot \eta_S)} = 0$$

Equation XVII completes the LED-TEC-Heat sink analysis.

The present invention provides in a first aspect a light illuminating device that comprises
  at least one light emitting diode (LED),
  at least one thermoelectric module (TEM) having a first surface which is thermally connected to the LED,
  a heat sink thermally connected to a a second surface of the at least one TEM,
  a thermally insulating cover creating a chamber substantially insulating the LED from ambient air.

The LED may be of any conventional type, the invention however is particularly useful for devices using hi-flux LEDs, including traffic lights, illuminated roadway and/or emergency signs, airport runway lights, vehicle lights including brake lights. In useful embodiments of the invention, the device comprises a plurality of LEDs.

It will be appreciated that the device of invention is able to produce more light per unit energy consumed, than corresponding LED-based lights without cooling, because the additional energy needed to operate the TEC is less than the energy and/or light output gained. Hence, in the most preferred embodiments of the invention, the device is configured such that the device produces more Illumination per unit consumed power when the TOC is applied to the TEM, than the illumination produced per unit consumed power when no TOC is applied to the TEM.

The thermal connection between the LED and TEM can be realized by an interface of thermally conducting material, e.g. a metal such as copper or aluminium. The surfaces of the TEM are typically referred to as the "hot side" and the "cold side", where the cold side is the first surface in contact with the LED and the hot side the second surface in contact with the heat sink or adjacent TEM optionally connected by a thermally conducting plate. However, it should be born in mind that the temperature gradient of the TEM can be reversed by reversing the current applied to the TEM.

To realize the desired efficiency that makes TEM cooling worthwhile, at least one TEM is chosen and configured such that the device can be operated by running a TEM-operating current (referred to herein as TOC) through the TEM which is substantially less that the maximum operating current for the TEM ($i_{max}$, typically the maximum operating current specified by the TEM manufacturer), preferably the TOC is less than about 25% of $i_{max}$, more preferably less than about 20% of the $i_{max}$, and even more preferably less than 15% of the $i_{max}$, such as less than about 12% of the $i_{max}$. Such configuration can surprisingly still prevent a decrease in light output due to an increase of the temperature of the LED(s).

In preferred embodiments, the optimal TOC is in the range of 200-600 mA, such as e.g. is in the range of 200-600 mA, or in the range of about 250-350 mA. These values would typically apply when using a TEM with $i_{max}$ of about 3.0 A.

It is not necessarily desired to obtain cooling of the LED substantially below the ambient temperature, on the contrary, the inventors have found that the desired efficiency and energy saving/light gain of the present invention is obtained by keeping the operating temperature of the LED close to or just below the ambient temperature. In some embodiments the operating temperature of the LED may even be slightly higher than the ambient temperature, but importantly, the LED operating temperature is prevented from rising much above ambient temperature, such as would be the case for an LED-lamp with no cooling. If the ambient temperature is, e.g., about 20-25° C., a non-cooled LED may be expected to warm up during operation and within a relatively brief period reach an operating temperature in the range of about 50-60° C., at which point the illumination of the LED has decreased by about 30-40% or more due to the negative Illumination-temperature coefficient.

The heat sink is generally of a conventional type, i.e. with a flat surface that is in contact with the TEM's hot side, while the other side of the heat sink has an extensive surface area to efficiently dissipate the heat to the air in contact with the heat sink.

The desired COP of the TEM of the device of the invention depends on the desired overall energy efficiency of the device, generally the device is configured and operated such that the COP of the TEM will lie in the range of about 2-6.

From the above discussion and analysis it follows that particularly preferred embodiments of the invention relate to devices configured such that the device produces more illumination per unit consumed power when the TOC is applied to the TEM, than the Illumination produced per unit consumed power when no TOC is applied to the TEM. For example, if the TOC consumes 30% of the energy consumed by LEDs of a multi-LED lamp, the total energy consumption is 130% when the device is being cooled and 100% If the device is operated with no cooling; if this prevents the diodes from warming up and loosing 50% light output, the number of diodes in the lamp can be halved in the cooled lamp to obtain the same light intensity, reducing the LED energy to 50% and thus the overall energy consumed is 80%, i.e., a net energy gain of 20% can be obtained in this example by cooling the LEDs in accordance with the invention.

In certain embodiments, the device of the invention comprises a plurality of TEMs. These may arranged side by side, e.g., each arranged to cool a set of LEDs. Also, TEM may be arranged in a stacked fashion, such that two, three or more TEM form a "sandwich" wherein the TEM closest to the LEDs has its hot side thermally connected (either directly adjacent or connected with a thermally conducting material) to the cold side of a second TEM, which also may have its hot side connected to the cold side of a third TEM and so forth. The layers of the stacked TEMs may overlap or bridge two or more TEMs of the next layer so as to provide multiple routes for heat transfer. When using such stacked TEM, the heat sink can be seen as comprising the combination of the additional TEMs, any intermediate heat-conducting plates and the heat sink itself furthest away from the LED in the sandwich of components.

The thermally insulating cover creating a chamber reduces flow of heat from ambient air to the LED, and is important in the situation where the LED is operated at a temperature below ambient temperature. The cover can be transparent so a not to block the light from the LED(s), and may be e.g. in the form of a lamp lens. However, in some embodiments, the enclosed chamber does not necessarily fully enclose the LED(s), but it still functions do reduce potential heat transfer from the environment to the LED. The chamber can, for example, have an opening for the lens of the LED.

In certain embodiments, the chamber has a higher pressure within the chamber than ambient pressure, during normal operation. This can be useful to prevent humidity from the air to enter the chamber. In other embodiments, the chamber may have a reduced pressure as compared to the ambient air pressure, and the chamber may even have a partial or substantial vacuum.

The device comprises in one embodiment a control unit for controlling and even reversing the TOC, and one or more sensors connected to the control unit for sensing one or more environmental parameters, wherein the control unit is configured to adjust the TOC based on parameters measured by the one or more sensors.

Such one or more sensors may comprise a temperature sensor for measuring the in situ temperature surrounding the LED(s), or the temperature of the LED itself, in which case the control unit essentially functions as a thermostat. Additionally, or alternatively, said one or more sensors may comprise a sensor for measuring emitted light from the LED(s), such that, for example, if light output decreases, the TOC is increased. The reverse can also be effected, i.e. decreasing the TOC to reducing the light output. Thus the device would ensure that a stable amount of light output is maintained.

It may in some cases be beneficial to operate the device with pulsed current to the one or more LEDs, e.g. such that current pulses alternate between different LEDs of the device.

In certain embodiments the device may be operated with pulsed current to the one or more TEMs, e.g., such that current pulses alternate between different TEMs of the device. In further embodiments, it may be beneficial to operate the device with pulsed current to the one or more LEDs and/or TEMs, e.g., such that current pulses alternate between different LEDs and/or TEMs of the device.

A related aspect of the invention provides a light illuminating device comprising at least one light emitting diode (LED) and at least one thermoelectric module (TEM) thermally connected to the LED, and a heat sink; wherein the at least one TEM is selected and configured such that by running a TEM-operating current (TOC) through the TEM, the thermal power produced by the at least one LED is transferred through the at least one TEM to the heat sink, thereby maintaining or lowering the temperature surrounding the LED and enhancing the light output from the LED; the device thus consuming less overall power per amount of emitted light when the TEM is running as compared to the overall power per same amount of light when the device is operated without running an operating current through the TEM.

In a further aspect, the invention provides a method for enhancing the efficiency of an light illuminating device having one or more LEDs as a light source, comprising: providing the device with one or more thermoelectric module(s) (TEM) having a cold surface and a hot surface, such that the cold surface is thermally connected to the LED and the hot surface is thermally connected to a heat sink; applying a TEM-operating current (TOC) to the one or more TEMs to create a temperature gradient through the TEM; adjusting the TOC such that substantially all of the thermal energy created by the LED(s) when operated is transferred to the heat sink, thereby substantially maintaining the operating temperature of the LED(s) at ambient temperature or a lower temperature, wherein the TEM is configured and TOC adjusted such that the device consumes less overall power per amount of emitted light when the TEM is running as compared to the overall power per same amount of light when the device is operated without applying a TOC to the TEM.

Preferably, the device is configured and operated such as described above, e.g. by applying a TOC that is less than 20% of the maximum operating current, $i_{max}$, for the one or more TEMs, and more preferably less than 15% of $i_{max}$. For example, if using a TEM with an, $i_{max}$ of 3.0 A a suitable TOC may be in the range of 200-600 mA, such as in the range of 250-500 mA, or in the range of 250-400 mA, such as about 300 or 350 mA.

FIGURE LEGENDS

DETAILED DESCRIPTION OF A PREFERRED EMBODIMENT

Figure 1:
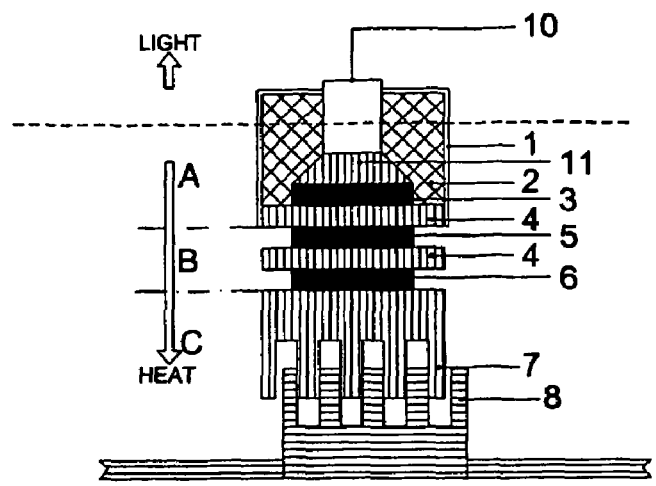
FIG. 1 illustrates schematically an embodiment of the invention, The device shown comprises an LED (10), a chamber (1), a first TEM (3) connected to the LED with a heat slug (11) of a thermally conducting material, two additional TEMs (5,6) and thermally conducting plates (4) connecting the first and second TEMs (3,5) and the second and third TEM (5,6).
Figure 2:
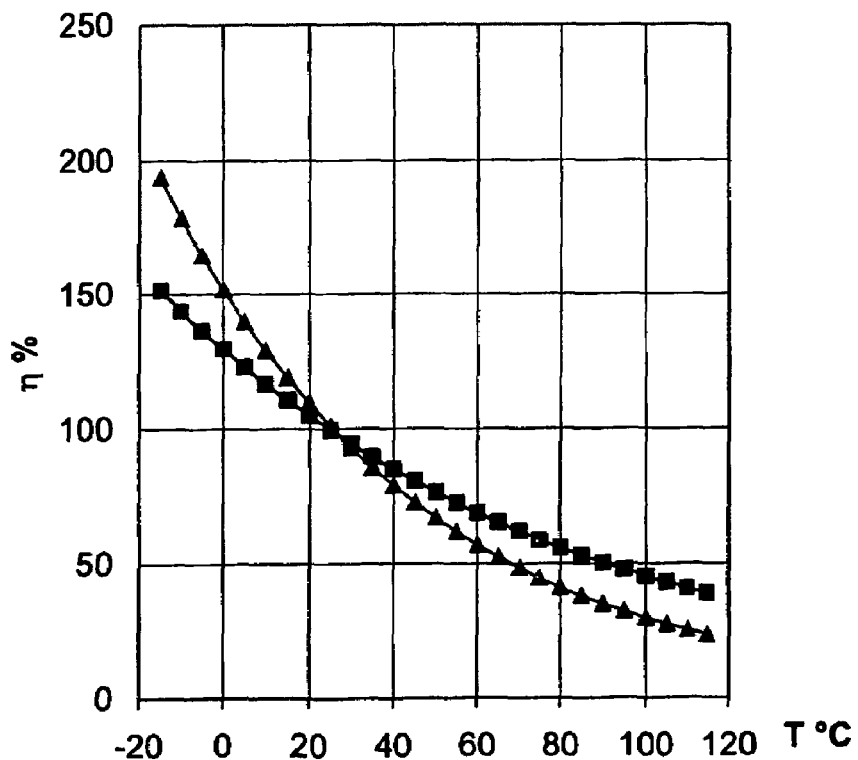
FIG. 2 is a graph showing fitted curves based on Equations Ia and Ib for two 1 W LED diodes; amber (triangles) and red (squares), normalized around 25° C.
Figure 3:
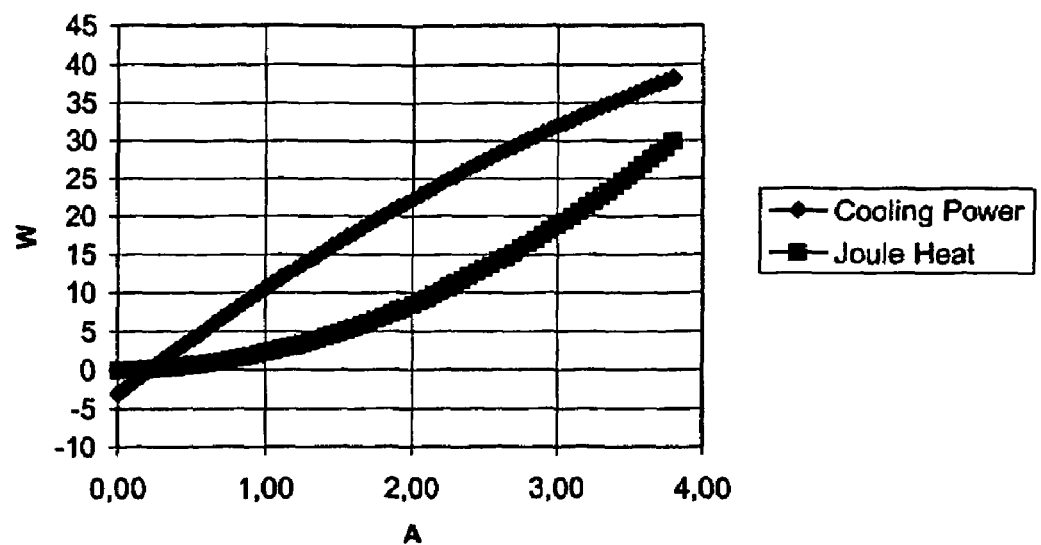
FIG. 3 shows the cooling power (diamonds) and Joule heat (squares) as functions of the operating current in Amperes, in a TEC of the following parameters: R=2 Ohm, K=0,6 W/K, α=0,05 V/K, $T_G$=480K, $(T_I/I)$=40 K/A.
Figure 4:
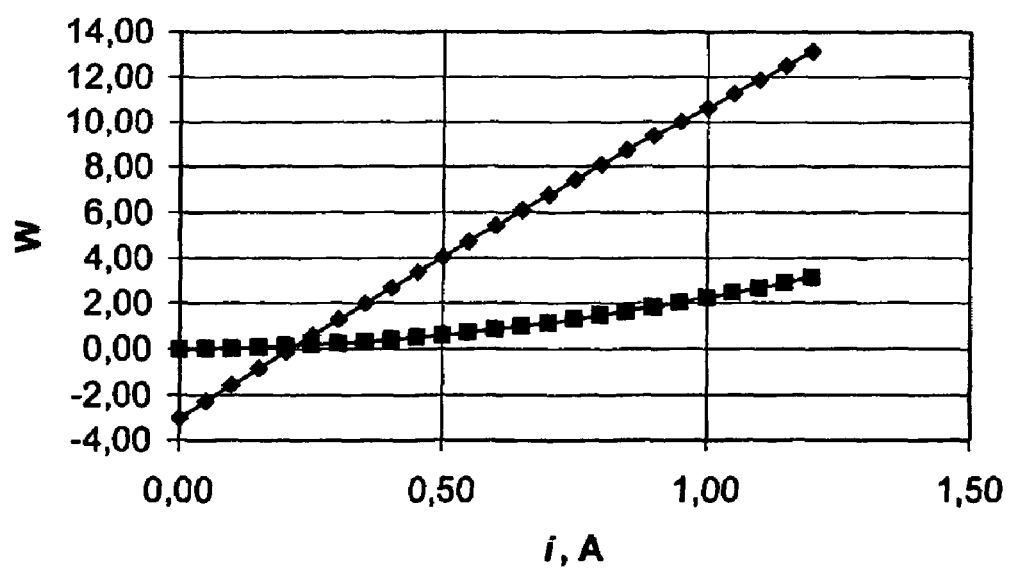
FIG. 4 shows a blow-up of the low-current regime of the diagram of FIG. 3.
Figure 5:
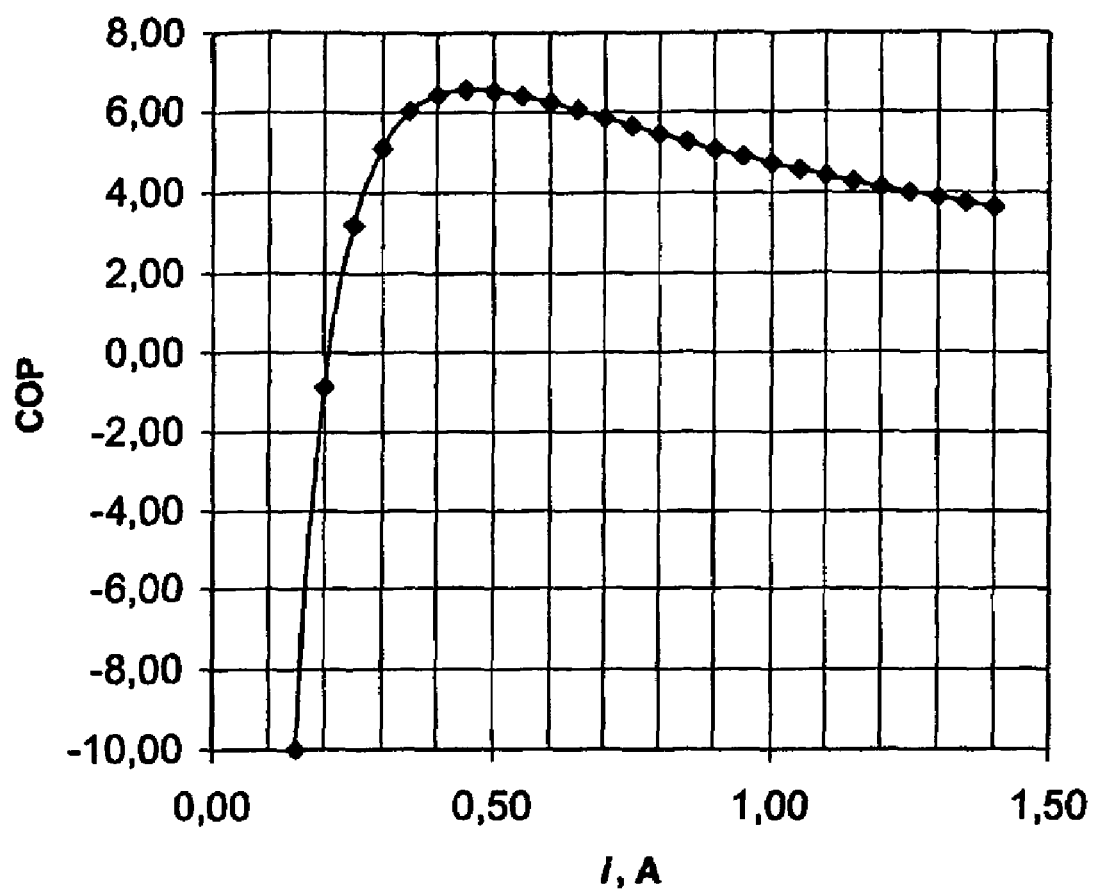
FIG. 5 shows the coefficient of performance (COP) as a function of the operating current in the low-current regime of a TEM having the same specifications as described listed above in the legend for FIG. 3.

The preferred embodiment described herein is Illustrated schematically in FIG. 1 and comprises an LED (10) based fixture with heat transfer apparatus attached to the LEDs, mounted individually and or in groups in critical outdoor applications for the purpose of light signalling and or wide area illumination type applications. The apparatus consists of a closed chamber (1) insulated with aerogel type material (2) to prevent ambient heat from loading the total heat removal. Inside the chamber is a thermo-electric module (3) with the hot side facing a thermally conductive plate (4). Said plate is the outmost boundary between the chamber and the adjacent micro-environment. Between the TEM (3) and the LED (10) is a conical heat slug (11) covering the LED thermal spot on the top and in contact of the cold side surface of the TEM on the other side. The total contact area for the LED (10) is less than the total area of the TEM (3). Outside the chamber (1) the cold side of a second TEM (5) is mounted on the thermally conductive plate (4) while a similar plate (4) is placed between TEM (5) and TEM (6). TEM (6) is the last unit next to the heat sink (7). The number of sets of TEMs and thermally conductive plates (4) placed in concession can vary. The heat sink (7) is constructed according to presented formulas. It is connected to an external structure (8) for final removal of the total heat.

If the LEDs are arranged within a housing the thermoelectric module may also be attached to the housing, and/or be a structural component of said housing.

The LEDs can be grouped in any geometrical order and attached to any curved and/or even surface. The angularity and alignment of LEDs (10) for the purpose of illumination and signalling is not an issue in this invention. The Peltier thermoelectric module (3) has one side hot and the other cold when activated with an electric current. The cold side is facing the connecting plate (11) attached to the LED (10) or could be directly mounted on the LED. A thermally conducting metal plate (4) is attached to the hot side of the TEM (3). Insulating material (2) (preferably aerogel) is fit around components to prevent heat flow from the ambient environment to the cooling area when ambient temperature is higher than the operating temperature of the cold side of the TEM (3,5,6) and to prevent back flow of heat in the system. Aerogels (2) have a very low thermal conductivity and even in very thin layers they are capable of insulating and or stopping the heat flow. The transition between the hot side of the TEM (3) and the heat sink (4) must be a vapour free material and able to withstand 1 bar pressure. The described embodiment can be constructed having two chambers. Chamber 1(A) is for the LEDs and the TEM. It is insulated with aerogels (2) except where the thermally conducting plate (4) is attached. The chamber (1) can be filled with dry air or other gases (inert gases) to a higher air pressure than average ambient pressure to prevent the flow of gases (in particular ambient air carrying moisture) into the chamber. The chamber (1) can be filled with gases other than air, e.g. Nitrogen, Argon or Helium, to further prevent moisture inside the chamber. A second chamber can be constructed surrounding the space (B) to ensure more efficient movement of heat from the thermally conducting plate (4) to the final heat sink (7)—and then to the support structure (8). Using another TEM (5) or (5,6) cascading modules (5,6) enables stabilization of the heat flow and provides a more constant temperature around the operating LED.

The invention claimed is:

1. A light illuminating device comprising at least one light emitting diode (LED) and at least one thermoelectric module (TEM) thermally connected to the LED, and a heat sink; wherein the at least one TEM is selected and configured such that by running a TEM-operating current (TOC) through the TEM, the thermal power produced by the at least one LED is transferred through the at least one TEM to the heat sink, thereby maintaining or lowering the temperature surrounding the LED and enhancing the light output from the LED; the device thus consuming less overall power per amount of emitted light when the TEM is running as compared to the overall power per same amount of light when the device is operated without running an operating current through the TEM.

2. A light illuminating device, comprising:
   a. at least one light emitting diode (LED);
   b. at least one thermoelectric module (TEM) having a first surface which is thermally connected to the LED;
   c. a heat sink thermally connected to a second surface of the at least one TEM; and
   d. a thermally insulating cover creating an enclosed chamber substantially insulating the LED from ambient air,
wherein the at least one TEM is configured such that the device is operated by running a TEM-operating current (TOC) through the TEM, which current is less than 20% of the maximum operating current for the TEM, thereby preventing a decrease in light output due to an increase of the temperature of the LED(s).

3. The device of claim 2, wherein the at least one TEM is configured such that the device is operated by running a TOC through the TEM, which current is less than 15% of the maximum operating current for the TEM.

4. A light illuminating device, comprising:
   a. at least one light emitting diode (LED);
   b. at least one thermoelectric module (TEM) having a first surface which is thermally connected to the LED;
   c. a heat sink thermally connected to a second surface of the at least one TEM; and
   d. a thermally insulating cover creating an enclosed chamber substantially insulating the LED from ambient air,
wherein the TEM is configured such that the operating temperature of the LED(s) is lower than or about the same as the ambient temperature surrounding the device.

5. A light illuminating device, comprising:
   a. at least one light emitting diode (LED);
   b. at least one thermoelectric module (TEM) having a first surface which is thermally connected to the LED;
   c. a heat sink thermally connected to a second surface of the at least one TEM; and
   d. a thermally insulating cover creating an enclosed chamber substantially insulating the LED from ambient air,
wherein the TOC for each of said at least one TEM is in the range of 200-600 mA.

6. The device of claim 5, wherein the TOC for each of said at least one TEM is in the range of 250-500 mA.

7. A light illuminating device, comprising:
   a. at least one light emitting diode (LED);
   b. at least one thermoelectric module (TEM) having a first surface which is thermally connected to the LED;
   c. a heat sink thermally connected to a second surface of the at least one TEM; and
   d. a thermally insulating cover creating an enclosed chamber substantially insulating the LED from ambient air,
wherein the TEM has a coefficient of performance (COP) during normal operation in the range of about 2-6.

8. A light illuminating device, comprising:
   a. at least one light emitting diode (LED);
   b. at least one thermoelectric module (TEM) having a first surface which is thermally connected to the LED;
   c. a heat sink thermally connected to a second surface of the at least one TEM; and
   d. a thermally insulating cover creating an enclosed chamber substantially insulating the LED from ambient air,
wherein the device is configured to produce more illumination per unit consumed power when the TOC is applied to the TEM, than the illumination produced per unit consumed power when no TOC is applied to the TEM.

9. The device of claim 8, comprising a plurality of LEDs.

10. The device of claim 8, comprising a plurality of TEMS.

11. The device of claim 8, comprising a plurality of TEMs thermally connected in a stacked fashion.

12. A light illuminating device, comprising:
 a. at least one light emitting diode (LED);
 b. at least one thermoelectric module (TEM) having a first surface which is thermally connected to the LED;
 c. a heat sink thermally connected to a second surface of the at least one TEM; and
 d. a thermally insulating cover creating an enclosed chamber substantially insulating the LED from ambient air, wherein the enclosed chamber has a higher pressure than ambient pressure during normal operation.

13. A light illuminating device, comprising:
 a. at least one light emitting diode (LED);
 b. at least one thermoelectric module (TEM) having a first surface which is thermally connected to the LED;
 c. a heat sink thermally connected to a second surface of the at least one TEM; and
 d. a thermally insulating cover creating an enclosed chamber substantially insulating the LED from ambient air, wherein the enclosed chamber has a lower pressure than ambient pressure, during normal operation.

14. A light illuminating device, comprising:
 a. at least one light emitting diode (LED);
 b. at least one thermoelectric module (TEM) having a first surface which is thermally connected to the LED;
 c. a heat sink thermally connected to a second surface of the at least one TEM;
 d. a thermally insulating cover creating an enclosed chamber substantially insulating the LED from ambient air;
 e. a control unit for controlling the TOC; and
 f. one or more sensors connected to the control unit for sensing one or more environmental parameters, wherein the control unit is configured to adjust the TOC based on parameters measured by the one or more sensors.

15. The device of claim 14, wherein said one or more sensors comprise a temperature sensor for measuring the in situ temperature surrounding the LED(s).

16. The device of claim 14, wherein said one or more sensors comprise a sensor for measuring emitted light from the LED(s).

17. The device of claim 14, which is operated with pulsed current to the one or more LEDs.

18. The device of claim 8, wherein the device is configured to be applied selected from traffic light, illuminated roadway and/or emergency signs, airport runway lights, vehicle lights including brake lights.

19. A method for enhancing the efficiency of an light illuminating device having one or more LEDs as a light source, comprising: a. providing the device with one or more thermoelectric module(s) (TEM) having a cold surface and a hot surface, such that the cold surface is thermally connected to the LED and the hot surface is thermally connected to a heat sink, b applying a TEM-operating current (TOC) to the one or more TEMs to create a temperature gradient through the TEM, c adjusting the TOC such that substantially all of the thermal energy created by the LED(s) when operated is transferred to the heat sink, thereby substantially maintaining the operating temperature of the LED(s) at ambient temperature or a lower temperature, d wherein the TEM is configured and TOC adjusted such that the device consumes less overall power per amount of emitted light when the TEM is running as compared to the overall power per same amount of light when the device is operated without applying a TOC to the TEM.

20. The method of claim 19, wherein the TOC is less than 20% of the maximum operating current for the one or more TEMs.

21. The method of claim 19, wherein the TOC is less than 15% of the maximum operating current for the one or more TEMs.

22. The method of claim 19, wherein the TOC for each of said at least one TEM is in the range of 200-600 mA.

23. The method of claim 19, wherein the TOC for each of said at least one TEM is in the range of 250-500 mA.

* * * * *